US005757931A

United States Patent [19]

Yamada et al.

[11] Patent Number: 5,757,931

[45] Date of Patent: May 26, 1998

[54] SIGNAL PROCESSING APPARATUS AND ACOUSTIC REPRODUCING APPARATUS

[75] Inventors: Yuji Yamada, Tokyo; Kiyofumi Inanaga, Kanagawa, both of Japan

[73] Assignee: Sony Corporation, Tokyo, Japan

[21] Appl. No.: 592,312

[22] PCT Filed: Jun. 2, 1995

[86] PCT No.: PCT/JP95/01082

§ 371 Date: May 14, 1996

§ 102(e) Date: May 14, 1996

[87] PCT Pub. No.: WO95/34883

PCT Pub. Date: Dec. 21, 1995

[30] Foreign Application Priority Data

| | | | |
|---|---|---|---|
| Jun. 15, 1994 | [JP] | Japan | 6-133338 |
| Jun. 17, 1994 | [JP] | Japan | 6-135983 |

[51] Int. Cl.[6] .......... H03G 3/00

[52] U.S. Cl. .......... 381/61; 381/17; 381/74

[58] Field of Search .......... 381/17, 18, 61, 381/63–74, 25

[56] References Cited

U.S. PATENT DOCUMENTS

| | | | |
|---|---|---|---|
| 4,338,581 | 7/1982 | Morgan | 381/63 |
| 5,025,472 | 6/1991 | Shimizu et al. | 381/63 |
| 5,173,944 | 12/1992 | Begault | 381/17 |

*Primary Examiner*—Paul Loomis
*Assistant Examiner*—Ping W. Lee
*Attorney, Agent, or Firm*—Jay H. Maioli

[57] ABSTRACT

A signal input at an input terminal (1) is divided into signals of two systems, and the signal of one system is supplied to a low-pass filter (2) and then fed to a downsampling processor (3). The downsampled signal is superimposed with an impulse response of a characteristic to be realized by an FIR filter (4), and outputted to an oversampling LPF (5), wherein a sampling frequency thereof is matched with a sampling signal of an inputted signal. The other signal of the second system of the two systems is extracted only as a high-band signal by a high-pass filter (6). The high-band signal is added to the output of the LPF (5) by an adder (7), and outputted from an output terminal (8). Thus, an accurate frequency response can be reproduced by use of an FIR filter with a short tap length.

7 Claims, 15 Drawing Sheets

F/G. 5

SIGNAL PROCESSING APPARATUS AND ACOUSTIC REPRODUCING APPARATUS

TECHNICAL FIELD

The present invention relates to a signal processing apparatus and an acoustic reproducing apparatus, and particularly to a signal processing apparatus using an FIR filter and an acoustic reproducing apparatus using such a signal processing apparatus.

BACKGROUND ART

Heretofore, there have been proposed many electronic devices wherein an impulse response of a system such as a signal transmission line is measured and such impulse response is reproduced by an FIR filter arranged in a signal processing apparatus. A reverberation apparatus using an FIR filter measures an impulse response of a room and the FIR filter reproduces such an impulse response so that a reproducing signal having the same reverberation characteristic as that obtained when sounds are reproduced in the room where the impulse response was measured can be reproduced under thoroughly different circumstances.

An acoustic reproducing apparatus using an FIR filter disposes an FIR filter for measuring an impulse response expressing a transfer characteristic of sounds emanating from speakers of a headphone to the listener's ears in a signal processing apparatus. Therefore, the above acoustic reproducing apparatus using the headphone can achieve a sound image localization effect equivalent to that obtained when sounds are reproduced by the speaker system.

However, in such a signal processing apparatus, when a filter having a converging time and frequency response faithful to the measured impulse response is composed of an FIR filter with high accuracy, it is necessary to use an FIR filter having a long tap length. Accordingly, many units of signal processing apparatus are required for such a signal processing, thereby an expensive and large-scaled system is required.

DISCLOSURE OF THE INVENTION

According to the present invention, an inputted digital audio signal is divided into signals of at least two frequency bands. The signal containing at least the low band frequency component of the divided signals is sampled by a sampling frequency lower than a sampling frequency of the inputted digital audio signal, and impulse responses ranging from a previously-measured sound generation source to a measuring point are superimposed upon the sampled signal by FIR filters. Therefore, the signal can be satisfactorily processed by use of even the FIR filter with the short tap length.

BEST MODE FOR CARRYING OUT THE INVENTION

Signal processing apparatus and acoustic reproducing apparatus according to the embodiments of the present invention will hereinafter be described with reference to the drawings.

Figure 1:
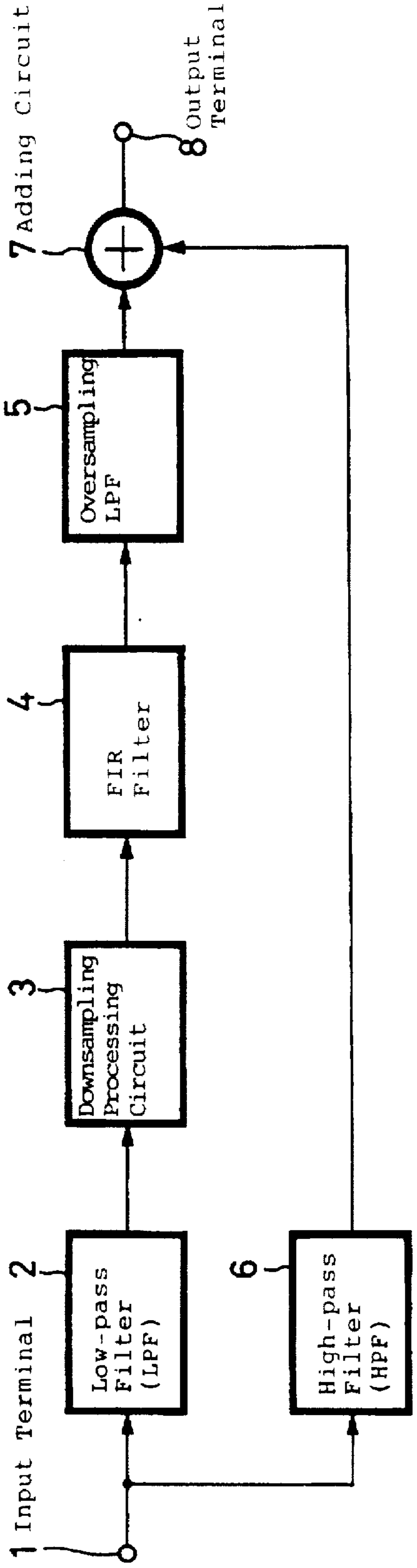
FIG. 1 is a block diagram of a signal processing apparatus according to a first embodiment of the present invention.

FIG. 1 shows a processing block of a signal processing apparatus according to a first embodiment of the present invention. In FIG. 1, a digital inputted signal inputted from an input terminal 1 is divided into signals of two systems. Of the signals of the two systems, one signal is supplied through low-pass filter (LPF) 2 which removes the occurrence of an aliasing distortion caused in a downsampling processing and then sampled by a downsampling processing circuit 3 at a sampling frequency lower than a sampling frequency of an inputted digital signal. If a digital signal of 44.1 kHz is inputted from the input terminal 1, then a frequency component under 11.025 kHz is extracted by the LPF 2 and the occurrence of the aliasing noise caused when the downsampling circuit 3 downsamples the inputted signal can be prevented. An outputted signal from the LPF 2 is supplied to the downsampling circuit 3, in which it is downsampled by a sampling frequency of 22.05 kHz which is ½ of the frequency of 44.1 kHz. If the downsampling circuit 3 carries out the downsampling processing, then it is possible to extend an impulse response time of the FIR filter at the succeeding stage.

The signal sampled by the downsampling processing circuit 3 is added with an impulse response characteristic to be realized by the FIR filter 4, and outputted to an oversampling LPF 5, in which the sampling frequency is matched with the sampling frequency of the digital inputted signal inputted to the input terminal 1. Another signal of the digital inputted signals of the two systems inputted from the input terminal 1 is extracted in a high band frequency component by a high-pass filter (HPF) 6 having the same cutoff frequency as that of the LPF 2. The high-frequency component is added to the output of the LPF 5 by an adding circuit 7 and outputted from an output terminal 8. The signal outputted from the output terminal 8 becomes a signal with a reverberation characteristic added thereto from a time-axis standpoint. In other words, the above signal is added with a spatial transfer characteristic through which sounds outputted from a speaker, i.e., sound source, reach the listener's ears.

Figure 2:
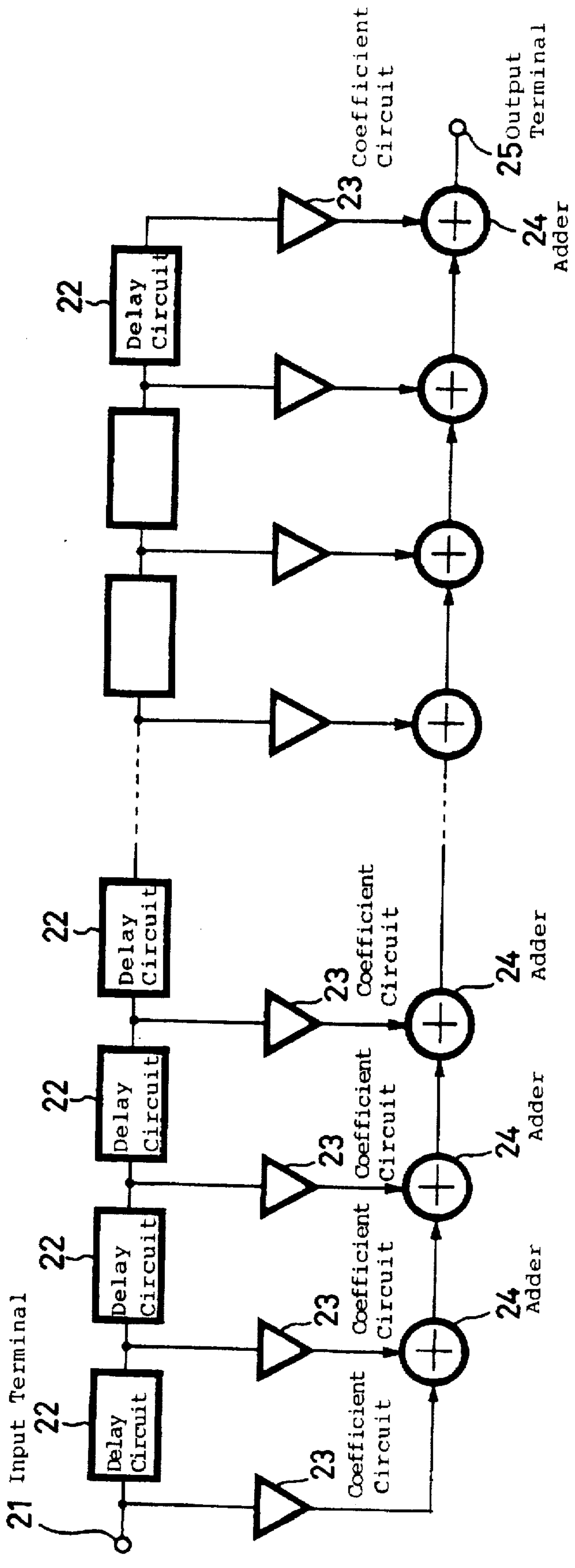
FIG. 2 is a block diagram of an FIR filter used in the embodiment.

FIG. 2 shows the FIR filter 4 used in the above embodiment. As shown in FIG. 2, a signal supplied to an input terminal 21, i.e., the outputted signal from the downsampling processing circuit 3, is supplied to several delay circuits 22 connected in series. These delay circuits 22 are composed of registers and memories. Signals delayed by the delay circuit 22 are sequentially transmitted by the clock signal of the sampling period. Taps are lead out from input and output terminals of these delay circuits 22, respectively. Signals from these taps are multiplied with a predetermined coefficient by coefficient circuits 23, and multiplied values from these coefficient circuits 23 are added by an adder 24, thereby being developed at an output terminal 25.

Accordingly, the FIR filter 4 performs a calculation for adding this impulse response to the inputted signal by setting the coefficient corresponding to the impulse response to the coefficient circuit 23. If such FIR filter 4 uses an FIR filter with the same tap length, then the sampling frequency is downsampled and the signal is delivered in the arrangement shown in FIG. 1. Therefore, a frequency of a clock signal of a sampling period during which signals stored in the delay circuits 22 are sequentially transmitted is lowered, and hence the response time of an outputted impulse response is extended.

According to the first embodiment, the impulse response is added to the low frequency component of the digital signal inputted by the LPF 2 by the FIR filter. The reason for this is that, if the impulse response is superimposed upon the low frequency component of the inputted digital signal, then when the signal outputted from the output terminal 8 is reproduced, a localization of sound image can be made clear. If the impulse response were added to the whole frequency band of the inputted digital signal, a circuit scale would become too large, and the signal processing apparatus and the acoustic reproducing apparatus would become inexpensive. In the first embodiment, as a result of experiments, it was confirmed that the localization of sound image of reproduced sound is made clear by superimposing the impulse response upon the frequency component under 11.025 kHz.

Therefore, according to the first embodiment, of the digital signals inputted to the input terminal 1, the signal of the low frequency component is downsampled and added with the impulse response by the FIR filter, whereby the length of the impulse response can be extended. Specifically, if the inputted digital signal, for example, is downsampled by the sampling frequency of ½ of the sampling frequency of the inputted digital signal, then the response time in the FIR filter with the same tap length can be extended twice.

Of the inputted digital signals, the signal extracted by the HPF 6 is not passed through the FIR filter 4 and added to the output of the above FIR filter 4. The signal extracted by the HPF 6 can be alleviated in the sense of incompatibility from an auditory sensation standpoint if the cutoff frequency of the HPF 6 is set on the band higher than 10 kHz to obtain the frequency component of higher than 10 kHz. Thus, the response time in the FIR filter can be extended, and hence the FIR filter with a short tap length can obtain a long impulse response.

According to the first embodiment, even when the FIR filter with the tap of a short length is used, the extended impulse response can be reproduced, thereby the scale of the signal processing apparatus is reduced considerably. Thus, when this signal processing apparatus comprises a digital signal processing IC or the like, the number of ICs used can be decreased considerably. Therefore, an area in which the signal processing apparatus is mounted can be reduced, power consumption can be decreased, and the system can be made inexpensive.

As described above, according to the first embodiment, the inputted digital audio signal is divided into two processing systems. One of the divided signals is inputted to the low-pass filter, the output of the low-pass filter is downsampled, and inputted to the FIR filter, whereafter the output is oversampled. Another signal of the divided signals is passed through the high-pass filter and added to the oversampled output. Therefore, the response time in the FIR filter can be extended, and excellent impulse response can be obtained even by the FIR filter with a short tap length.

Figure 3:
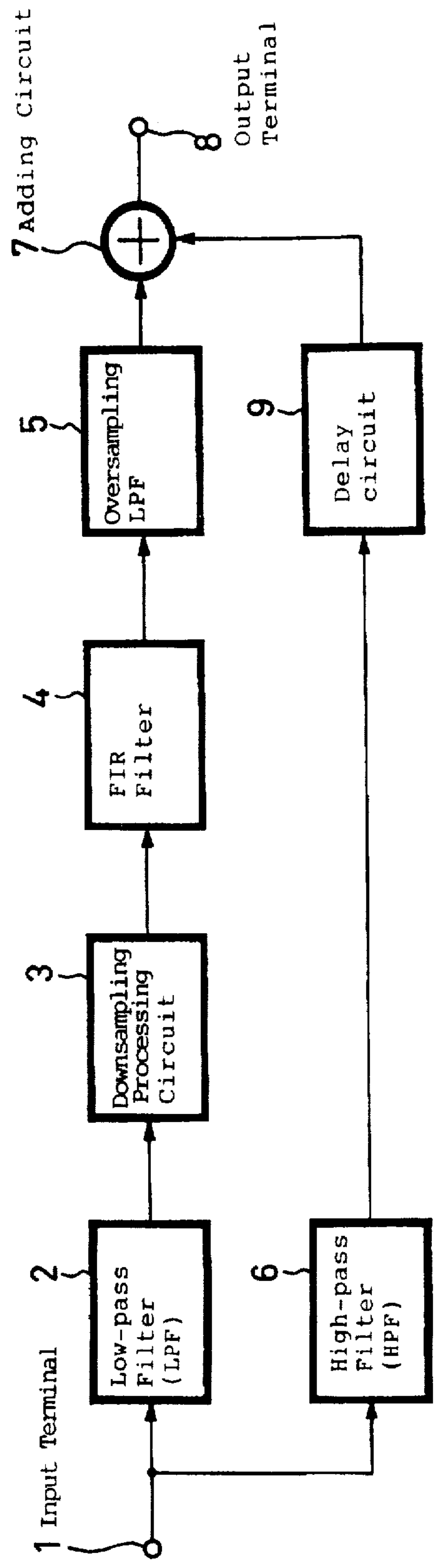
FIG. 3 is a block diagram of a signal processing apparatus according to a second embodiment of the present invention.

FIG. 3 shows a processing block of a signal processing apparatus according to a second embodiment of the present invention. Parts common to those of the arrangement shown in FIG. 1 are denoted by identical reference numerals and will not be described herein in detail. In FIG. 3, the other signal of the divided signals of the two systems obtained when the signal inputted from the input terminal 1 is divided is extracted only in a high frequency component by the HPF 6. The high frequency component is delayed by a delay circuit 9 by a predetermined time, added with the output of the LPF 5 by the adding circuit, and outputted from the output terminal 8.

The delay time of the delay circuit 9 is set to be the same as the delay time produced when the signal is processed by the FIR filter 4 or the like, whereby the phase of the outputted signal from the LPF 5 and the phase of the outputted signal from the HPF 6 are matched with each other. Alternatively, the delay time of the delay circuit 9 is set in such a manner that the outputted signal from the HPF 6 is delayed from the outputted signal from the LPF 5 by several microseconds. Accordingly, one of the above delay times is selected so that tone separation obtained when the signal outputted from the output terminal 8 is reproduced is removed by precedence effect. The arrangement of the FIR filter 4 is similar to that of FIG. 2.

Therefore, according to the second embodiment, the high frequency component outputted from the HPF 6 is delayed by a predetermined time, and added to the outputted signal from the LPF 5. Consequently, the low frequency component of the sound generation source in the signal with musical sounds or the like inputted thereto is outputted, and the high frequency component of the same sound generation source is outputted, thereby improving the sensation of incompatibility of localization of a sound image caused when an impulse response is not superimposed upon the high frequency component due to precedence effect.

According to the second embodiment, since the signal from the HPF is delayed by the delay circuit by the predetermined time, and added to the output of the oversampling filter, in addition to the effects achieved by the first embodiment, it is possible to remove the problem that the high frequency component is outputted before the low frequency component. Alternatively, when an outputted signal is reproduced by a speaker or the like, if the high frequency component is intentionally delayed from the low frequency component, then a shifted sound image localization position can be improved by the precedence effect.

In the first and second embodiments, the high-pass filter for extracting the high frequency component of the inputted digital signal is previously so designed as to have a characteristic approximate to the pass band portion of the frequency response. Therefore, in addition to the effects achieved by the first and second embodiments, frequency responses of the whole band as well as the low frequency component from the FIR filter can be approximated to the target characteristics. Accordingly, the frequency response of the signal added with the low frequency component finally becomes the characteristic approximate to the frequency characteristic to be reproduced.

As described above, according to the apparatus of the first and second embodiments, if the high-pass filter is arranged to have a characteristic approximate to a frequency characteristic of high band of a frequency characteristic reproduced by the FIR filter, then a frequency response of a signal that is finally added with the low frequency component can be approximated to a target frequency characteristic to be reproduced.

Figure 4:
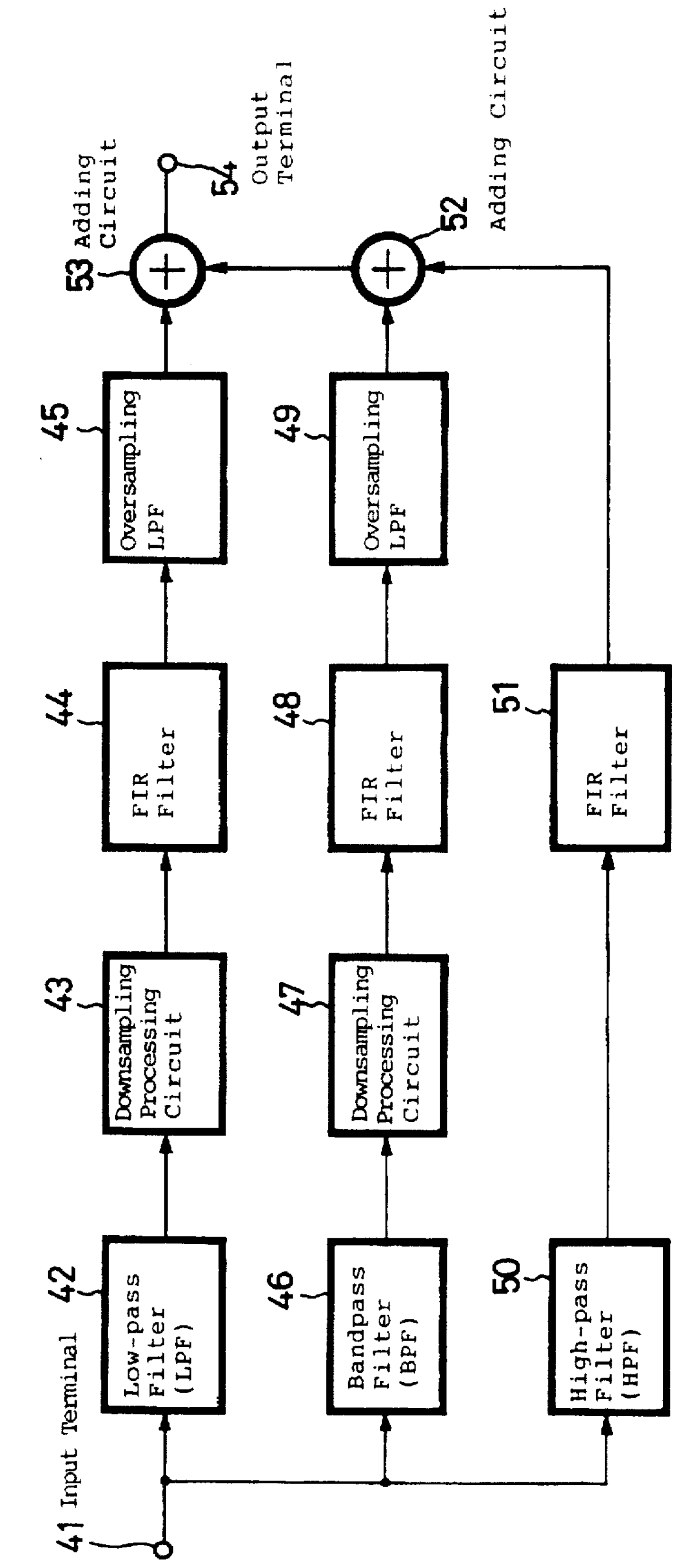
FIG. 4 is a block diagram of a signal processing apparatus according to a third embodiment of the present invention.

FIG. 4 shows a processing block of a signal processing apparatus according to a third embodiment of the present invention. In FIG. 4, a digital signal and a digital audio signal of 44.1 kHz are inputted from an input terminal 41, and supplied to three signal processing systems. In the third embodiment which will be described below, a high band frequency component of sound outputted from a speaker in a listening room is attenuated quickly so that an impulse response of an approximate frequency component of the inputted digital signal can be reproduced with a fidelity as high as possible.

Of the inputted digital signal, the signal of the first signal processing system is supplied to a low-pass filter (LPF) 42 which eliminates the occurrence of an aliasing distortion generated in a down-sampling processing of the later stage, and then sampled by a sampling frequency lower than that of the inputted digital signal, e.g., sampling frequency of ¼ of the above sampling frequency by a down-sampling processing circuit 43. A cutoff frequency of the LPF 42 is set to be 1.5 kHz, for example. The signal thus sampled by the down-sampling processing circuit 43 is superimposed upon an impulse response of a characteristic to be realized by an FIR filter 44, and then supplied to an over-sampling LPF 45, in which it is oversampled so as to have the same sampling frequency as that of the inputted digital signal.

Of the inputted digital signal, the signal supplied to the second signal processing system is supplied to a bandpass filter (BPF) 46 which eliminates the occurrence of an aliasing distortion generated in the down-sampling processing similar to the first signal processing system, and then sampled by a sampling frequency lower than the sampling frequency of the inputted digital signal, e.g., sampling frequency of ½ the above sampling frequency. A pass band frequency of the BPF 46 lies in a range of from 5 kHz to 11.02 kHz. The sampled signal is superimposed upon the impulse response of the characteristic to be realized by the FIR filter 48, and outputted to an oversampling LPF 49, in which its sampling frequency is oversampled so as to have the same sampling frequency as that of the inputted digital signal.

The signal supplied to the third signal processing system is extracted only in a high band frequency component by a high-pass filter (HPF) 50, and a high band frequency characteristic is reproduced by an FIR filter 51 from a high band frequency component. A cutoff frequency of the HFP 50 is set to be 11.025 kHz, for example. An output from the FIR filter 51 is added by an adding circuit 52 to the output of the LPF 49, and further added by an adding circuit 53 to the output of the LPF 49, thereby outputted from an output terminal 54. The FIR filters 44, 48 and 51 are similar to those of FIG. 2 in arrangement, and tap lengths necessary for superimposing respective band characteristics are selected independently. In the third embodiment, the FIR filter 44, for example, has the longest tap length, and the FIR filter 51 has the shortest tap length. The FIR filter 48 has an intermediate tap length between the tap lengths of the FIR filters 44 and 51.

Therefore, according to the third embodiment, the inputted digital signal can be divided into the signals of a plurality of frequency bands, and can be processed at every frequency band by the FIR filters while the sampling frequencies are being changed. That is, the FIR filter with a long response time is used to accurately reproduce a low band frequency characteristic, and the FIR filter with a relatively short response time can accurately reproduce a frequency characteristic of a high band. In other words, when the listener listens to sounds emanated from the speaker in the listening room, a frequency component higher than the low band frequency component is quickly attenuated. For this reason, the low band frequency component is processed by the FIR filter with the long tap length so that it can be reproduced with a fidelity as high as possible. The high band frequency component is processed by the FIR filter with the short tap length, and the middle band frequency component is processed by the FIR filter with the intermediate tap length between those of the above-mentioned FIR filters, whereby sounds can be reproduced with a fidelity as high as that in the listening room. Accordingly, a long response time and an accurate frequency response can be reproduced from the low band frequency component by lowering the sampling frequency, and an accurate frequency response can be reproduced from the high band frequency component by the FIR filter with the short tap length. Therefore, the tap lengths of FIR filters can be selected effectively.

Therefore, the inputted digital signal is divided into signals of a plurality of frequency bands and the optimum tap number of FIR filters and the down-sampling frequency for signal processing can be selected in the respective bands. Further, since the long impulse response can be reproduced with the accurate frequency response even by use of the FIR filters with less taps in total, a circuit scale necessary for signal processing can be reduced considerably. Moreover, since the number of ICs used when this signal processing apparatus is composed of digital signal processing ICs can be reduced considerably, the area in which the ICs are mounted on the circuit board can be decreased, and a power consumption of the signal processing apparatus can be reduced. In addition, the system can be made inexpensive.

As described above, in the apparatus according to the third embodiment, the inputted digital signal is divided into signals of different frequency bands, and processed by different sampling frequencies in the FIR filters at every separated frequency bands. Therefore, the long response time and the accurate frequency response can be realized by down-sampling the low band frequency component with the lowered sampling frequency, and the accurate frequency response can be reproduced from the high band frequency component by use of the FIR filter with the short tap length. Thus, the FIR filter length can be selected effectively.

Figure 5:
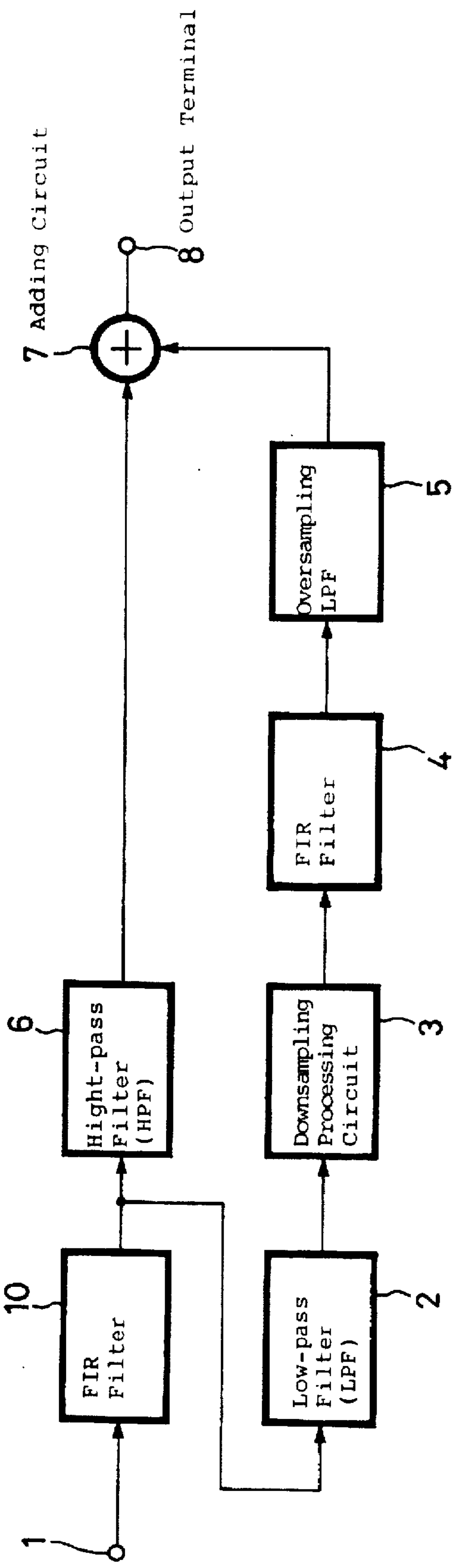
FIG. 5 is a block diagram of a signal processing apparatus according to a fourth embodiment of the present invention.

FIG. 5 shows a processing block of a signal processing apparatus according to a fourth embodiment of the present invention, wherein elements and parts common to those of FIG. 1 are marked with identical reference numerals and therefore need not be described in detail. In FIG. 5, a signal inputted from the digital inputted signal input terminal 1 is superimposed upon an impulse response for realizing the high band frequency response by an FIR filter 10, and an outputted signal from the FIR filter 10 is respectively supplied to two signal processing systems. The signal supplied to one signal processing system is supplied through the LPF 2, which eliminates an aliasing distortion generated in the following downsampling processing, to the downsampling processing circuit 3, in which it is downsampled by the sampling frequency lower than that of the inputted digital signal.

The signal sampled by the downsampling processing circuit 3 is superimposed upon the impulse response of the low band characteristic to be realized by the FIR filter 4 and outputted to the oversampling LPF 5, in which it is oversampled by the same sampling frequency as that of the inputted digital signal.

The outputted signal from the FIR filter 10 supplied to the other signal processing system is supplied to a HPF 6 with the same cutoff frequency as that of the LPF 2, in which only its high band frequency component is extracted. This high band frequency component is added by the adding circuit 7 to the output of the LPF 6, and then outputted from the output terminal 8. The FIR filter 4 is arranged similarly to that of FIG. 2, and tap lengths necessary for superimposing respective band characteristics are selected independently.

Therefore, according to the fourth embodiment, the FIR filter 10 of the first stage has a relatively short tap length to realize a high band frequency characteristic. The output from the FIR filter 10 is divided by the high-pass filter 6 and the low-pass filter 2, in which the low band frequency component is downsampled, and a long impulse response is realized. Thus, an accurate frequency response can be realized.

In the apparatus according to the fourth embodiment, the inputted digital audio signal is processed by the FIR filter 10 with the same sampling frequency as that of the inputted digital signal. The outputted signal from the FIR filter 10 is supplied to the low-pass filter 2, and the output from the LPF 2 is downsampled, and inputted to the FIR filter 4. The output from the FIR filter 4 is oversampled, and the outputted signal from the FIR filter 10 is processed by the high-pass filter 6, and added to the oversampled output. Therefore, the FIR filter 10 can be composed of a relatively short tap length. Thus, a high band frequency characteristic can be realized, and an accurate frequency response can be realized.

In the fourth embodiment, if the arrangement shown in FIG. 5 is inserted into the portion of the FIR filter 4 one more time as it is, then the frequency bands and the downsampled state can be divided more finely. In this case, FIR filters with optimum tap lengths and sampling frequencies can be selected in a plurality of frequency bands, thus enabling a more accurate frequency response to be realized.

According to the above-mentioned apparatus, the output from the low-pass filter 2 is again processed by another FIR filter corresponding to the FIR filter 10 of FIG. 5, which samples the above output by the same sampling frequency as that of the inputted digital signal, and then supplied to the two signal processing systems, respectively. The signal supplied to one signal processing system is further inputted to the low-pass filter, and the output of the low-pass filter is downsampled and inputted to the FIR filter. The output of that filter is oversampled and then outputted. The signal supplied to the other signal processing system is processed by the high-pass filter and added to the oversampled output. Then, the added output is further added to the outputted signal from the HPF 6 by the adding circuit 7. Therefore, FIR filters with optimum tap lengths and sampling frequencies can be selected at respective frequency bands. Thus, an accurate frequency response can be realized.

Figure 6:
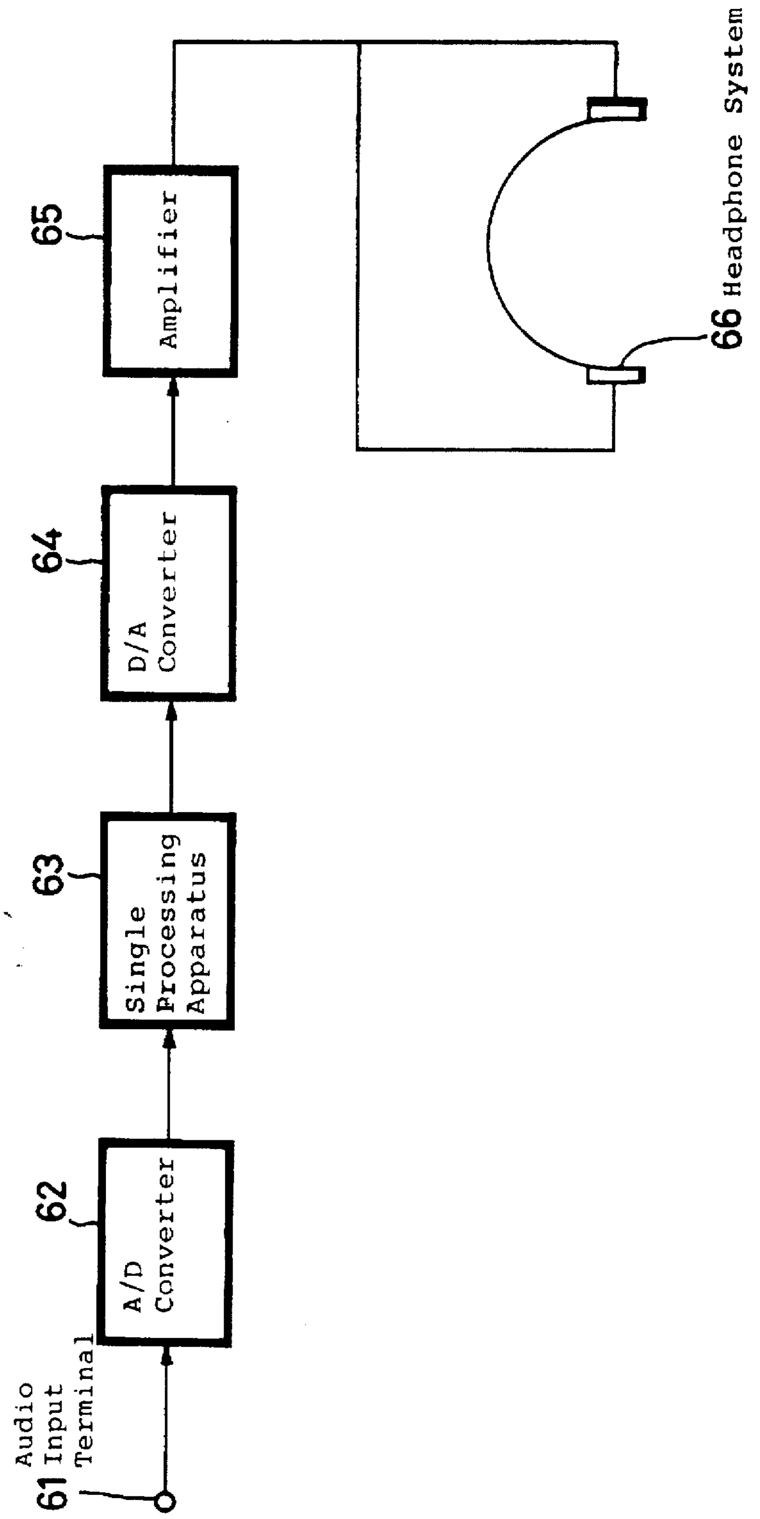
FIG. 6 is a block diagram of a signal processing apparatus applied to an acoustic reproducing apparatus according to the embodiment of the present invention.
Figure 7:
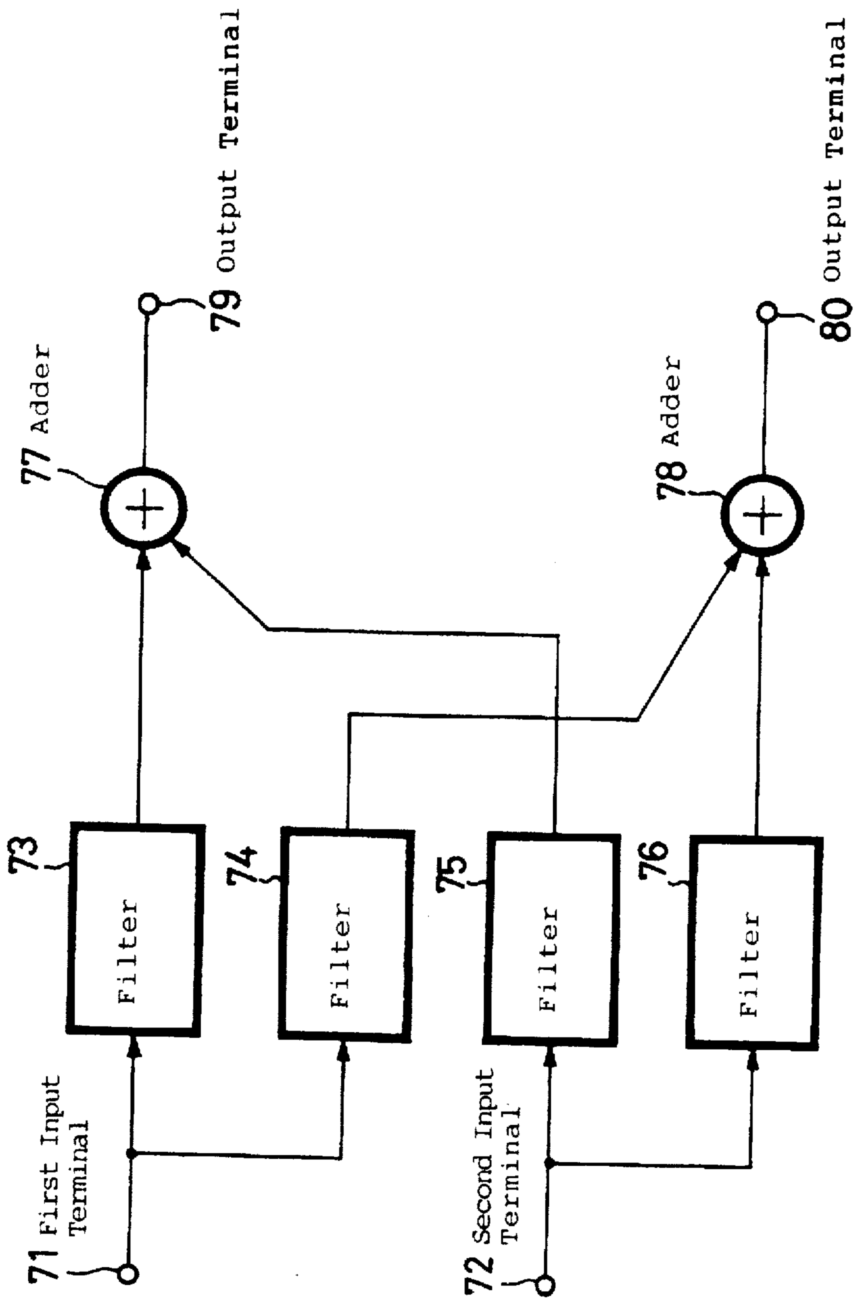
FIG. 7 is a block diagram of a signal processing apparatus applied to an acoustic reproducing apparatus according to the embodiment of the present invention.

FIGS. 6 and 7 show the embodiment in which the signal processing apparatus according to the present invention is applied to the acoustic reproducing apparatus.

FIG. 6 shows an overall arrangement of an acoustic reproducing apparatus with a headphone. In FIG. 6, an analog audio signal inputted from an audio input terminal 61 is converted by an A/D converter 62 into a digital signal, e.g., a digital audio signal of 44.1 kHz. The digitized signal is inputted to a signal processing apparatus 63, in which it is filtered in order to localize a sound image.

Specifically, the signal processing apparatus 63 previously measures four kinds of impulse response from two sound generation sources located at the front, for example, of the listener's ears, and the measured characteristics are superimposed upon the digital signal by the filters shown in FIG. 7.

In FIG. 7, signals inputted to first and second input terminals 71, 72, e.g., signals of L and R channels are supplied to filters 73, 74 and 75, 76, respectively. Signals from these filters 73, 75 are added by an adder 77, and signals from the filters 74, 76 are added by an adder 78. These added signals are developed at first and second output terminals 79, 80.

The filters 73 through 76 use the signal processing apparatus using the FIR filters shown in FIGS. 3 to 5. The signals outputted to the output terminals 79, 80 are converted by a D/A converter 64 into analog audio signals of L and R channels, amplified by an amplifier 65, and then fed to a pair of speaker units of a headphone system 66. Therefore, the listener wearing the headphone system on the head can listen to sounds outputted from the headphone system 66 as if the listener were listening to sounds reproduced from the speaker system. That is, the center of sounds outputted from the left and right speaker units of the headphone system, i.e., localization is not positioned in the listener's head but positioned outside of the listener's head, i.e., in front of the listener's head.

The filters 73 to 76 can simplify the FIR filters, and it is possible to provide a miniaturized and inexpensive acoustic reproducing apparatus.

In the embodiment shown in FIGS. 6 and 7, the acoustic reproducing apparatus can obtain a localization of reproduced sound image by use of the headphone. However, the present invention can be applied to the replacement of the FIR processing in the system where sounds are reproduced by the speakers and sound images are localized outside the two speakers.

Specifically, in the apparatus shown in FIGS. 6, 7, if the filters for superimposing impulse responses from the sound generation source to ears upon the digital signal are composed of the signal processing apparatus shown in FIGS. 1 through 5, then localization or forward localization of the reproduced sound image can be considerably improved compared with the conventional case that the above filters are composed of the FIR filters with constant sampling frequencies and with the same taps.

In the embodiment shown in FIGS. 6 and 7, there is illustrated the acoustic reproducing apparatus using the headphone to obtain localization of reproduced sound image. However, the present invention can be applied to the system wherein the sound image is reproduced from the speakers and the sound image is localized up to the outside of the two speakers.

Further, if the present invention is applied to a sound field simulation system, then it is possible to reproduce a long response time by less taps. As a result, while a conventional reverberation generator picks up an impulse response only as a characteristic pulse macroscopically with a coarse time interval as compared with a sampling time, a reverberation generator can use dense pulses distributed at every sampling time, thus enabling a sound field to be reproduced with higher fidelity.

Figure 8:
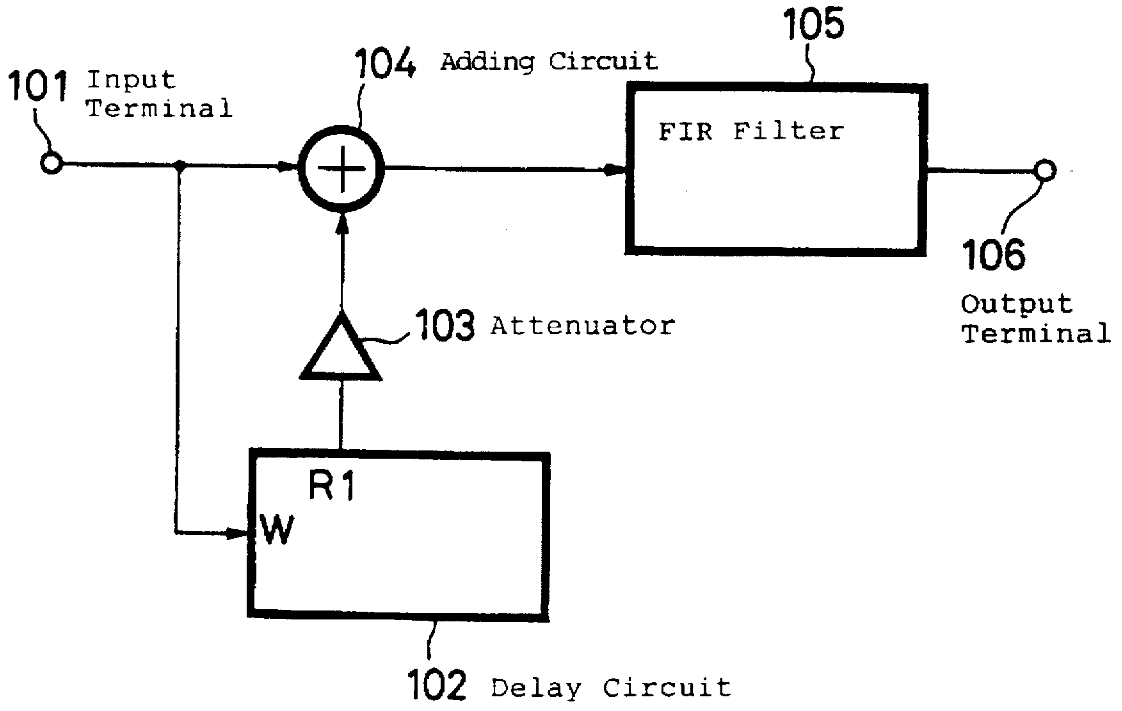
FIG. 8 is a block diagram of a signal processing apparatus according to a fifth embodiment of the present invention.

FIG. 8 shows a signal processing apparatus according to a fifth embodiment of the present invention. In FIG. 8, a digital audio signal inputted from an input terminal 101 is supplied to two signal processing systems. The signal supplied to one signal processing system is inputted to and delayed by a delay element 102 by a predetermined time, and then outputted. The signal outputted from the delay element 102 is attenuated by an attenuator 103, and added to the digital signal inputted thereto from the input terminal 101 by an adding circuit 104, whereafter it is supplied to an FIR filter 105. Then, the impulse response is superimposed upon the digital signal inputted to the FIR filter 105 by use of a coefficient previously-set in the FIR filter 105, and then outputted from an output terminal 106.

An attenuation factor of the attenuator 103 is set to be such a value that the impulse response of the inputted digital signal may be smoothly connected to the impulse response of the output from the delay element 102, as will be described later on.

Figure 9:
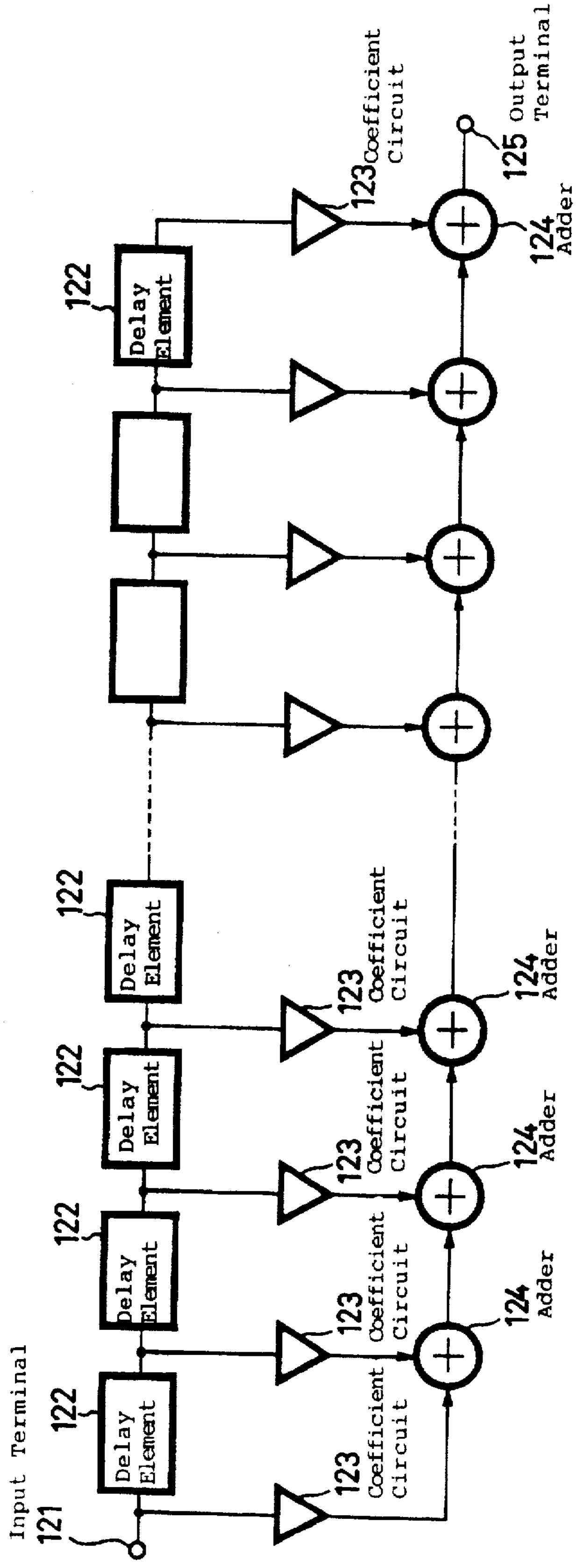
FIG. 9 is a block diagram of an FIR filter used in the fifth embodiment.

FIG. 9 shows the FIR filter 105 used in the fifth embodiment. In FIG. 9, a signal supplied to an input terminal 121 is supplied to a large number of delay elements 122 connected in series. Signals delayed by these delay elements 122 are sequentially transferred by a clock signal of a sampling period. Taps are respectively led out from the input and output terminals of these delay elements 122.

Signals from these taps are multiplied with predetermined coefficients by coefficient elements 123. Multiplied results from the coefficient elements 123 are added by adders 124, and outputted to an output terminal 125. Accordingly, in the FIR filter 105, this impulse response is superimposed upon the digital signal by setting coefficients corresponding to the impulse response to the coefficient elements 123.

Figure 10A:
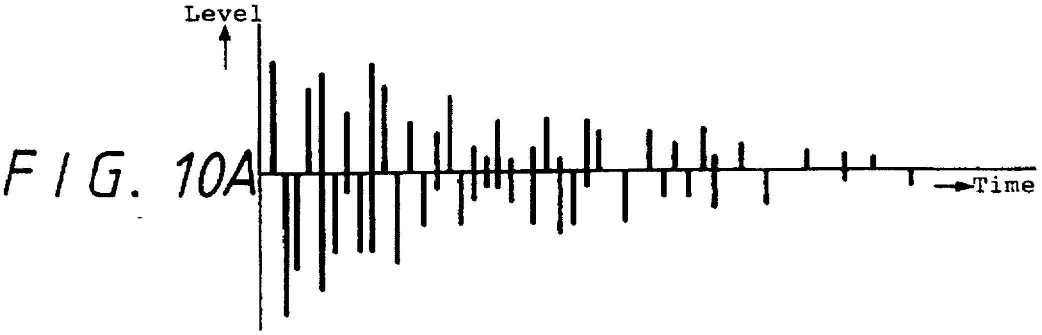
FIG. 10 is a graph showing an example of a measured impulse response.
Figure 10B:
Figure 10C:
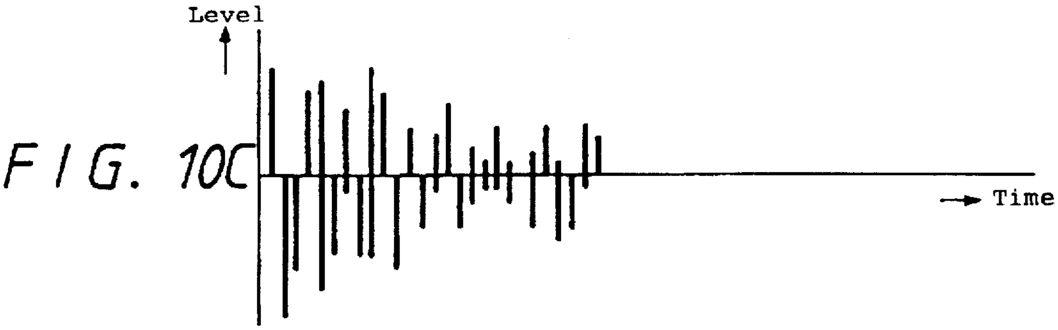

In such FIR filter 105, FIG. 10A shows an example of a measured impulse response. On the other hand, since the tap length of the FIR filter 105 is finite, if this filter is composed of the ordinary FIR filter shown in FIG. 9, then only a response corresponding to such tap length can be made, and hence such response is reproduced up to a time t1 (FIG. 10B) and then interrupted as shown in FIG. 10C.

Figure 11A:
FIG. 11 is a graph showing a signal delayed by a time t1 by a delay circuit and which is further attenuated.
Figure 11B:
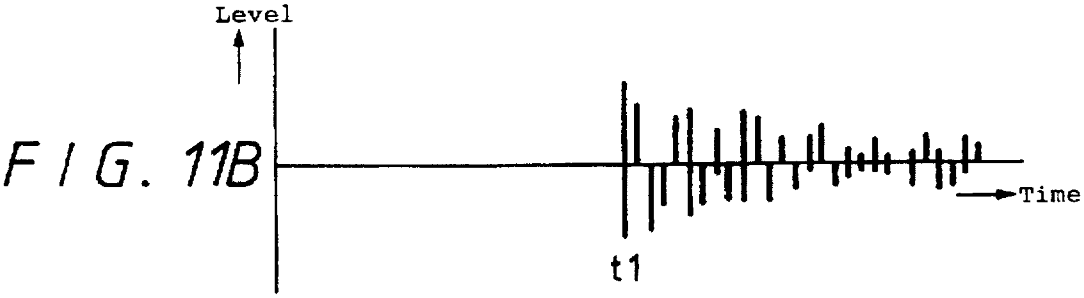
Figure 11C:

On the other hand, if the signal, which has been delayed by the time t1 by the delay element 102 and further attenuated as shown in FIG. 11A, is inputted to this FIR filter, then the FIR filter 105 outputs a response shown in FIG. 11B in response to such input. Therefore, with the arrangement shown in FIG. 8, if the inputted signal and the signal, which has been delayed by the time t1 and further attenuated, are directly inputted to the FIR filter 105, then the output of such filter becomes one which results from mixing the outputs of FIGS. 10C and 11B, i.e., response shown in FIG. 11C, and hence an impulse response time can be extended substantially. In that case, the delayed signal outputted from the delay element 102 is attenuated by the attenuating element 103 so that the response shown in FIG. 10C and the response shown in FIG. 11B can be connected smoothly.

In the apparatus according to the fifth embodiment, the inputted digital audio signal is respectively supplied to a plurality of signal processing systems, the signal supplied to one signal processing system of a plurality of signal processing systems is delayed and attenuated by the attenuators and the delay elements, and the attenuated and delayed signal is inputted to the FIR filter. Therefore, the response time of the FIR filter can be extended apparently, and the response time of necessary length can be processed by the FIR filter with the short tap length.

The signal supplied to the other signal processing system is delayed and attenuated by the delay elements and the attenuators, the attenuated and delayed signal is added to the signal supplied to the other signal processing system, and then inputted to the FIR filter. Therefore, initially, the signal, which is not delayed, i.e., the digital signal inputted from the input terminal, is inputted to the FIR filter. Then, the signal, which is delayed at the time the impulse response of the inputted digital signal is almost completed, is inputted to the FIR filter one more time. As a result, the length of the response can be apparently extended twice by the FIR filter, and hence the long impulse response can be obtained by the FIR filter with the short tap length.

Therefore, according to the apparatus of the fifth embodiment, since the long impulse response can be reproduced by use of the FIR filter with the short tap length, the scale of the signal processing can be decreased considerably. Thus, when this apparatus is composed of digital signal processing ICs, the number of ICs used can be decreased considerably. Thus, naturally, the area in which the ICs are mounted can be reduced, the power consumption can be reduced, and the system can be made inexpensive.

Figure 12:
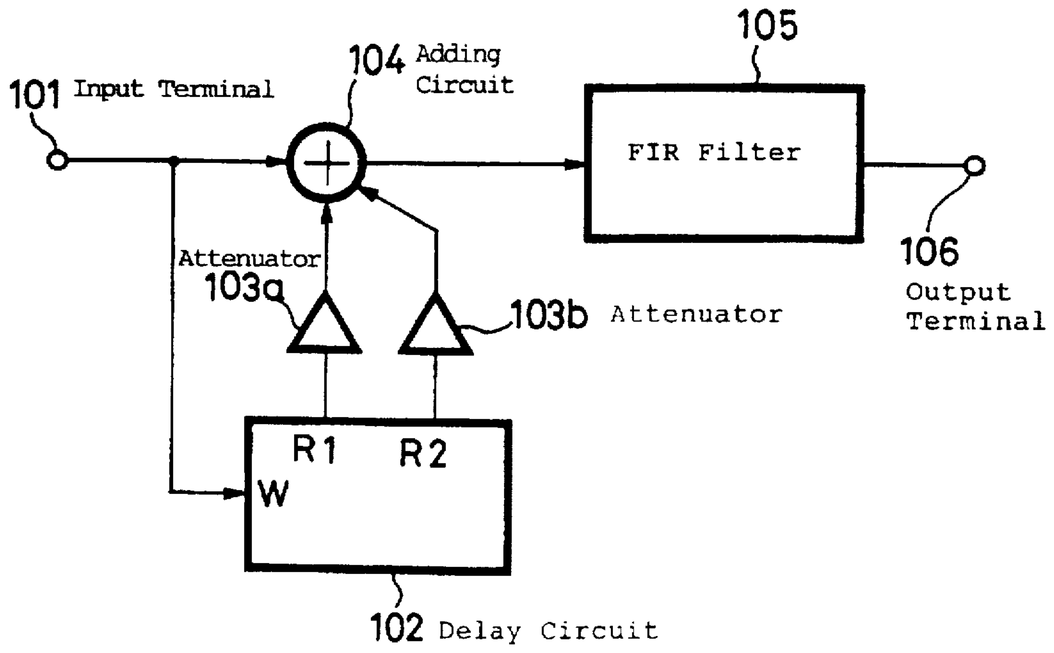
FIG. 12 is a block diagram of a signal processing apparatus according to a sixth embodiment of the present invention.

FIG. 12 shows a processing block of a signal processing apparatus according to a sixth embodiment of the present invention. In FIG. 12, a digital signal inputted from the input terminal 101 is supplied to two signal processing systems. The signal supplied to one signal processing system is inputted to the delay element 102, in which it is delayed by two different delay times or more, and then outputted. Signals that are delayed by two different delay times by the delay element 102 are attenuated by attenuators 103*a*, 103*b*, added to the signal inputted from the input terminal 101 by the adding circuit 104, and inputted to the FIR filter 105. Then, this FIR filter 105 superimposes the impulse response upon the inputted signal by use of the coefficient previously-set thereto and outputs the resultant signal from the output terminal 106. The FIR filter 105 is similar to that of FIG. 10 in arrangement. Attenuation factors of the attenuators 103*a*, 103*b* are set to be such values that the impulse response of the digital signal inputted from the input terminal 101 and the impulse response of the delayed signal can be smoothly connected similarly to the fifth embodiment. Moreover, the attenuation factor of the attenuator 103*b* is set to be larger than that of the attenuator 103*a*.

The digital signal inputted to the input terminal 101 is supplied to the delay element 102 which output two signals delayed by two different delay times. In the case of the sixth embodiment, the delay time of the signal outputted from a terminal R2 of the delay element 102 is longer than that of the signal outputted from a terminal R1 of the delay element 102. The two signals outputted from the delay element 102 are supplied to the attenuators 103*a*, 103*b*, in which they are attenuated by different attenuation factors. The outputted signals from the attenuators 103*a*, 103*b* are added to the digital signal inputted to the input terminal 101 by the adding circuit 104, and then inputted to the FIR filter 105. In the FIR filter 105, the impulse response is superimposed upon the digital signal, which is not delayed, inputted to the input terminal 101, and then outputted from the FIR filter 105. Subsequently, in the FIR filter 105, the impulse response is superimposed upon the signal, which is outputted from the terminal R1 of the delay element 102 and attenuated by the attenuator 103*a*, and then outputted from the FIR filter 105. In that case, since the delayed signal is attenuated by the attenuator 103*a*, similarly to the fifth embodiment, the impulse response based on the digital signal inputted to the input terminal 101 and the signal, which is delayed and attenuated by the attenuator 103*a*, are connected smoothly. Further, in the FIR filter 105, the impulse response is superimposed upon the signal, which was outputted from the terminal R2 of the delay element 102 and attenuated by the attenuator 103*b*, and then outputted from the FIR filter 105. At that time, similarly as described above, the impulse response of the delayed signal attenuated by the attenuator 103*b* can smoothly be connected to the impulse response of the delayed signal attenuated by the attenuator 103*a*.

Therefore, according to the sixth embodiment, there are provided a plurality of times t1 in which signals are delayed by the delay element 102, and the tap length of the FIR filter 105 can be reduced more in the fifth embodiment.

Figure 13:
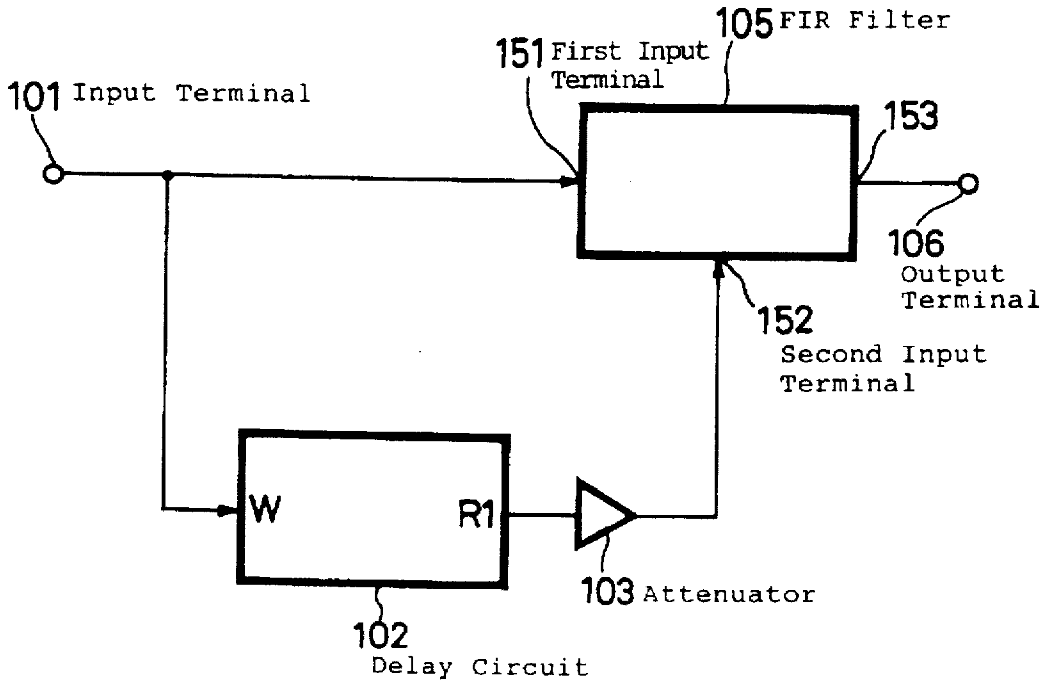
FIG. 13 is a block diagram of a signal processing apparatus according to a seventh embodiment of the present invention.

FIG. 13 shows a processing block of a signal processing apparatus according to a seventh embodiment of the present invention. In FIG. 13, the digital signal inputted from the input terminal 101 is supplied to the two signal processing systems. The digital signal supplied to one signal processing system is directly inputted to a first input terminal 151 of the FIR filter 105. Moreover, the signal inputted to the other signal processing system is inputted to the delay element 102, in which it is delayed by a predetermined time, and then outputted. The signal outputted from the delay element 102 is attenuated by the attenuator 103, and inputted to a second input terminal 152 of the FIR filter 105.

Figure 14:
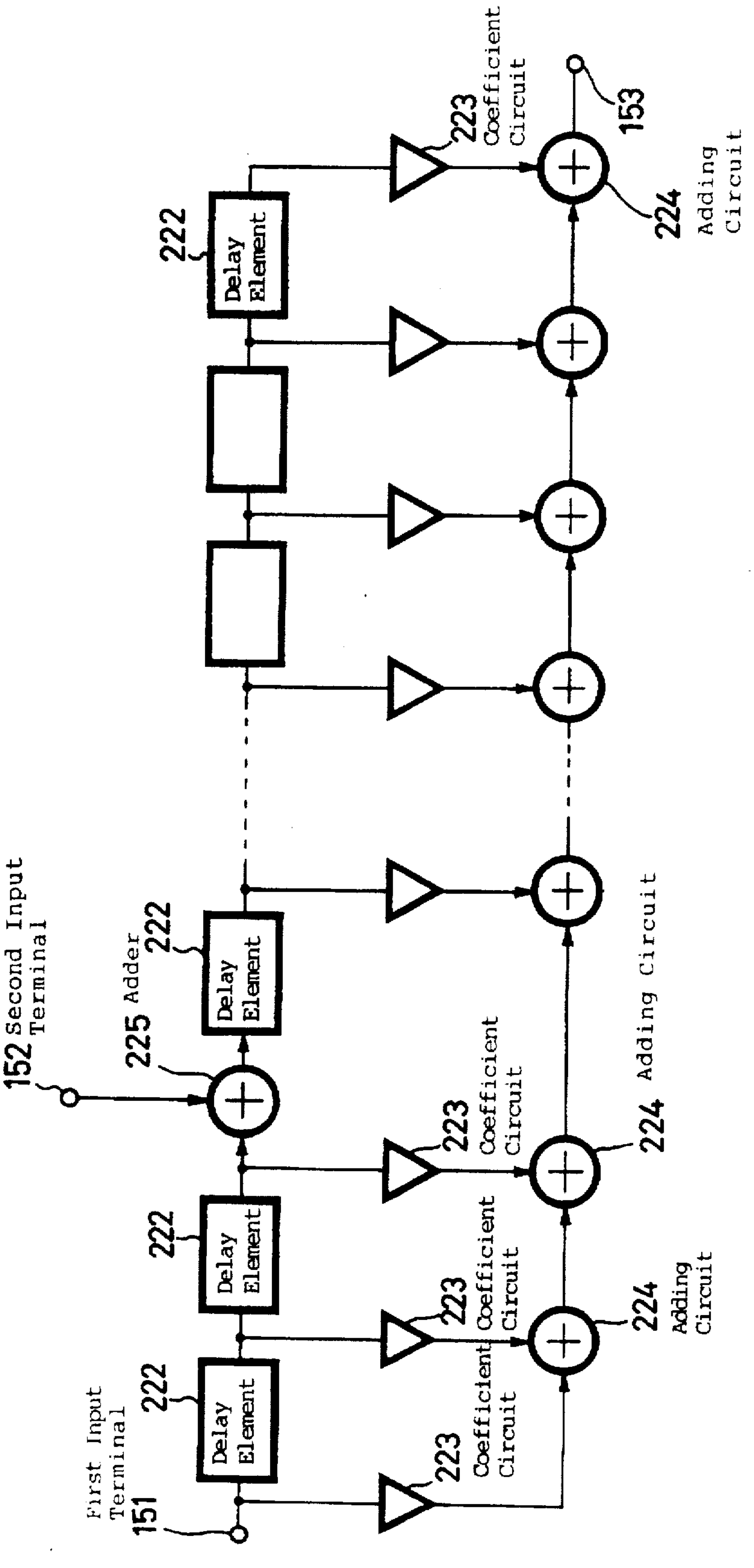
FIG. 14 is a block diagram of an FIR filter.

The FIR filter 105 is arranged as shown in FIG. 14. The digital signal inputted from the input terminal 101 is supplied to a plurality of delay elements 222 connected in series. Signals delayed by these delay elements 222 are sequentially transferred to the delay elements 222 based on a clock of a sampling period. Signals obtained at the output terminals of the delay elements 222 are supplied to coefficient elements 223, in which they are multiplied with predetermined coefficients. Multiplied results from the coefficient elements 223 are added by an adding circuit 224, and then outputted from an output terminal 253. The FIR filter 105 shown in FIG. 14 includes a second input terminal 152, and the outputted signal from the attenuator 103 is supplied to the second input terminal 152. The signal inputted to the second input terminal 152 is added by an adder 225 to the signals delayed by a plurality of delay elements 222, in the case of FIG. 14, the signals delayed by the two delay elements 222. Specifically, the adder 225 is connected to a plurality of delay elements 222 in series, and located at the position which becomes a border between initial reflection sounds and broken sounds among a plurality of delay elements 222. Sounds, which are outputted from the speaker system and heard by the listener in the listening room, are roughly classified as initial reflection sounds and broken sounds. When the signal inputted to the second input terminal 152 is added to signals which are supplied to the delay elements 222 of the stage following the stages corresponding to broken sounds, it is possible to realize a sound field in which the listener can listen to sounds as if the listener were listening to sounds with higher fidelity in the listening room.

The length of initial reflection sound changes with the size of the listening room, and hence the position at which the adder 252 is inserted or disposed is not limited to the position between the delay element 222 of the second stage and the delay element 222 of the third stage as shown in FIG. 14 but may be varied properly in accordance with the size of the assumed listening room. Specifically, according to the arrangement of the seventh embodiment, an added response portion becomes a portion which results from excluding a portion near the leading edge of the impulse response. The portion near the leading edge of the impulse response is occupied by the initial reflection sound in the reverberation of a room such as the listening room or the like. However, the second half portion of the impulse response is a response mainly composed of broken sounds, and a response having characteristics different from those of the initial reflection sound. Accordingly, if the response based on the signal delayed by the delay element 102 is added to the portion following the portion near the leading edge of the impulse response as described above, then an impulse response portion close to broken sounds is added to such portion, making the response more natural.

Therefore, according to the seventh embodiment, since the long impulse response can be reproduced by use of the FIR filter with the short tap length, the number of ICs required when the apparatus is composed of digital signal processing ICs can be lessened considerably. Thus, naturally, the area in which the above integrated circuits are mounted can be reduced, the power consumption can be decreased, and the system can be produced inexpensively.

In the apparatus according to the seventh embodiment, the signal supplied to one signal processing system is supplied to attenuators and delay elements. The signal supplied to the other signal processing system is directly inputted to the FIR filter, and the signal attenuated and delayed is inputted to the adder disposed in somewhere of the FIR filter. As a result, the signal, which is not delayed, i.e., the digital signal inputted from the input terminal 101, is inputted to the FIR filter. This time, the signal delayed at the time point the impulse response is almost completed is inputted between the taps of the FIR filter. The FIR filter outputs the impulse response corresponding to broken sounds based on the inputted and delayed signal. Thus, the length of the response provided by the FIR filter becomes equivalent to that provided by the addition of a tap length following a tap inserted into somewhere between the taps. Accordingly, the FIR filter with the short tap length can produce a long impulse response, and the response can be made more natural.

Figure 15:
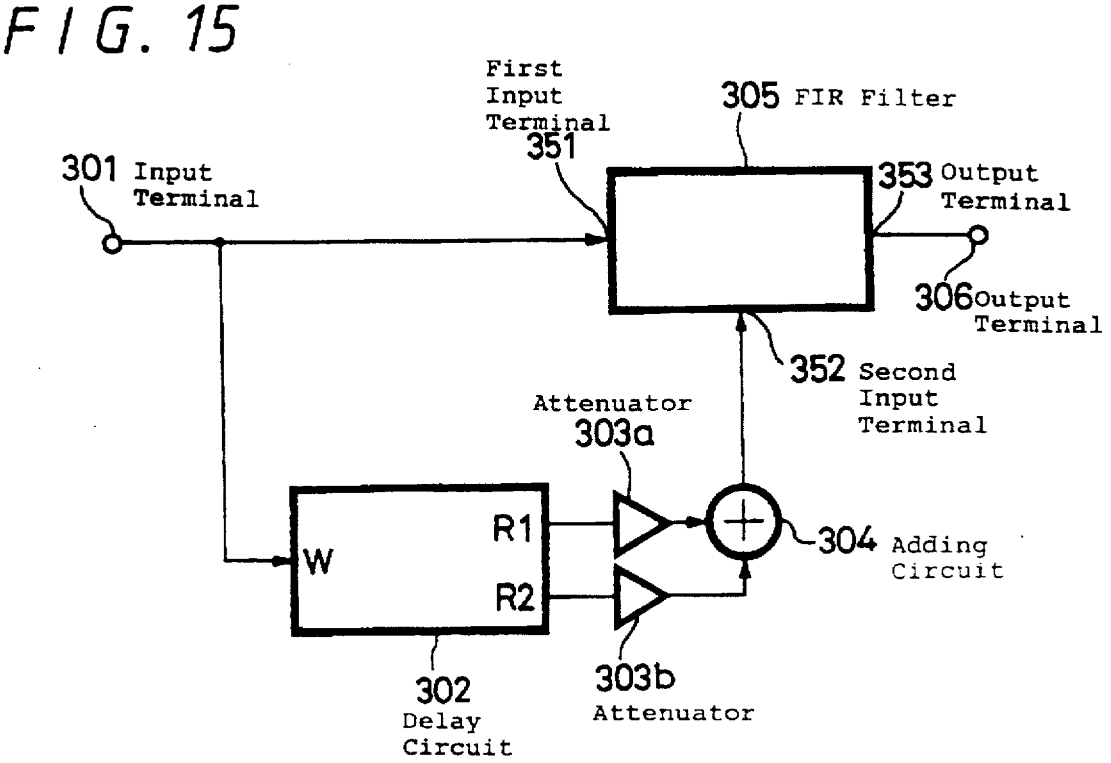
FIG. 15 is a block diagram of a signal processing apparatus according to an eighth embodiment of the present invention.

FIG. 15 shows a processing block of a signal processing apparatus according to an eighth embodiment of the present invention. In FIG. 15, a digital signal inputted from an input terminal 301 is supplied to two signal processing systems. The signal supplied to one signal processing system is inputted to a delay element 302, in which it is delayed by two different delay times or greater, and then outputted. The signals with different delay times from the delay element 302 are attenuated by attenuators 303*a*, 303*b*, added by an adding circuit 304, and inputted to a second input terminal 352 of an FIR filter 305. Then, an impulse response is superimposed upon the signal inputted to the FIR filter 305 by use of a coefficient previously set in the FIR filter 305, and then outputted from an output terminal 306. The FIR filter 305 is similar in arrangement to the FIR filter shown in FIG. 14, and the rest thereof is similar to that of FIG. 13.

In the signal processing apparatus according to the eighth embodiment, the digital signal inputted from the input terminal 301 is inputted to the first input terminal 351 of the FIR filter 305 and inputted to the delay element 302. The signal inputted to the delay element 302 is delayed by different delay times by the delay element 302, and outputted signals are respectively outputted from output terminals R1, R2. In the case of the eighth embodiment, the delay time of the signal outputted from the output terminal R2 of the delay element 302 is longer than that of the signal outputted from the output terminal R2 of the delay element 302. The two delayed signals outputted from the delay element 302 are supplied to and attenuated by attenuators 303*a*, 303*b*, respectively. In that case, the attenuation factor of the attenuator 303*b* is larger than that of the attenuator 303*a*. Outputted signals from these attenuators 303*a*, 303*b* are added by the adding circuit 304, and supplied to the second input terminal 352 of the FIR filter 305.

In the FIR filter 305, the impulse response is superimposed upon the digital signal inputted to the first input terminal 351, and then outputted from an output terminal 353. Subsequently, of the delayed and attenuated signals inputted to the second input terminal 352, the impulse response corresponding to broken sounds is superimposed upon the signal outputted from the attenuator 303*a*, and then outputted from the output terminal 353. At that time, since the signal delayed by the attenuator 303*a* is attenuated to the predetermined level, the impulse response of the signal inputted to the first input terminal 351 can be smoothly connected to such delayed and attenuated signal similarly to FIG. 11C.

Furthermore, the impulse response corresponding to broken sounds is superimposed upon the delayed and attenuated signal attenuated by the attenuator 303*b* after having inputted to the second input terminal 353 of the FIR filter 305, and then outputted from the output terminal 353. At that time, since the signal outputted from the output terminal R2 of the delay element 302 is attenuated by the attenuator 303*b* by the attenuation factor larger than that of the signal outputted from the attenuator 303*a*, this signal is outputted from the FIR filter 305 which is connected to the impulse response of the signal outputted from the attenuator 303*a* and which is also smoothly connected to the impulse response outputted from the attenuator 303*a*.

Therefore, according to the eighth embodiment there are provided a plurality of times t1 which are delayed by the delay elements in the embodiment of FIG. 13. Thus, the tap length of the FIR filter can be reduced more.

Figure 16:
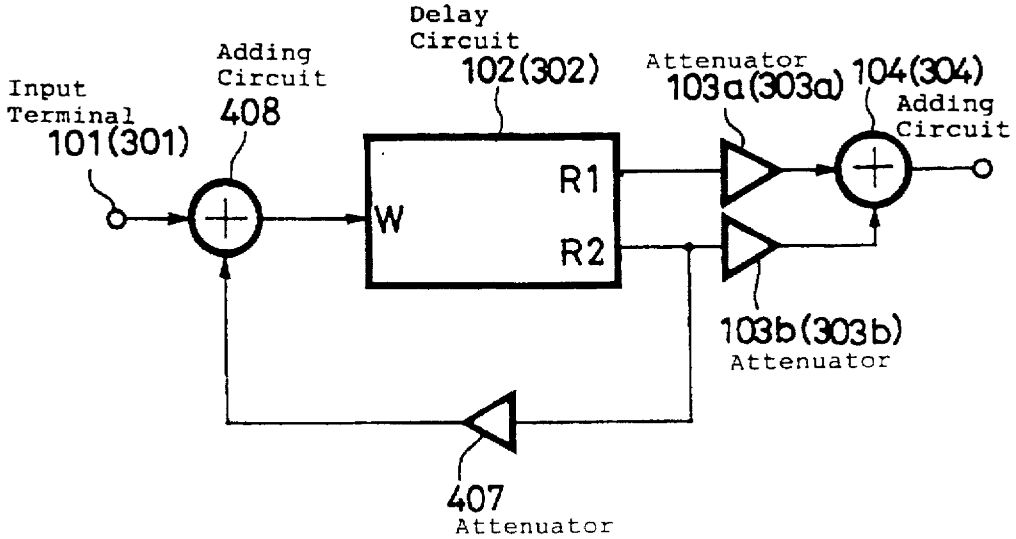
FIG. 16 is a block diagram of a signal processing apparatus according to a ninth embodiment of the present invention.

FIG. 16 shows a processing block of a signal processing apparatus according to a ninth embodiment of the present invention. In FIG. 16, any one of the outputted signals from the delay elements 102, 302 in the embodiment shown in FIG. 15, in this embodiment, outputted signals from the attenuators 103*b*, 303*b* are inputted through the attenuators 103*b*, 303*b* to the adding circuits 104, 304, and also attenuated by an attenuator 407 and fed back to the input stage of the delay elements 102, 302. Specifically, signals attenuated by the attenuator 407 are added by an adding circuit 408 provided in front of the delay elements 102, 302, and inputted to the input terminals of the delay elements 102, 302. In the case of the ninth embodiment, the outputted signals from the attenuators 103*a*, 303*a* may be supplied to the attenuator 407.

Figure 17:
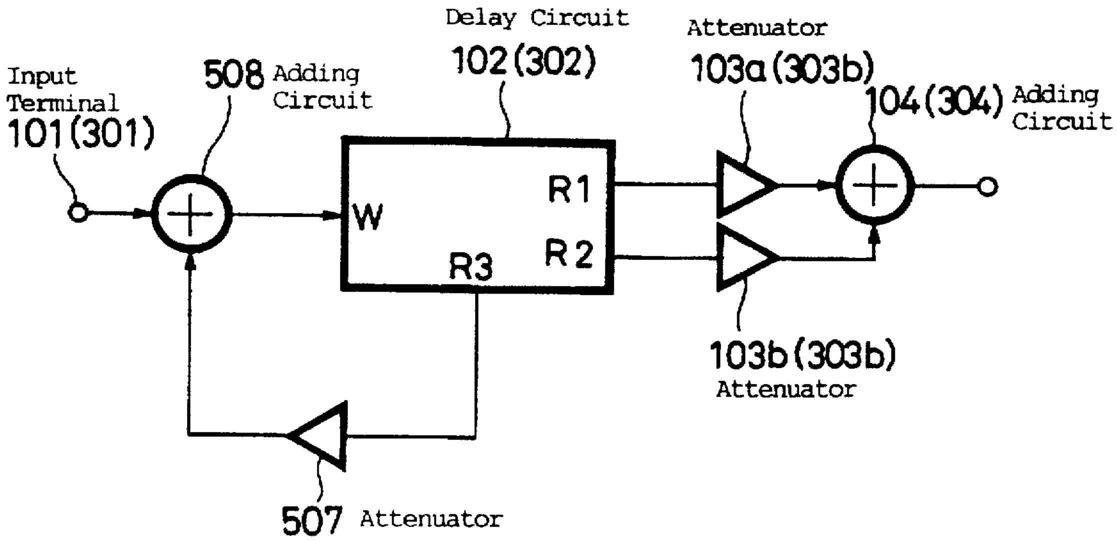
FIG. 17 is a block diagram of a signal processing apparatus according to a tenth embodiment of the present invention.

FIG. 17 shows a processing block of a signal processing apparatus according to a tenth embodiment of the present invention. In FIG. 17, signals, which are further delayed, are generated from the delay elements 102, 302 of the embodiments of FIGS. 12 and 15, attenuated by an attenuator 507, and fed back to the input stages of the delay elements 102, 302. Specifically, the signals attenuated by the attenuator 507 are added by an adding circuit 508 provided at the front stages of the delay elements 103, 302, and the signals added with the digital signals inputted from the input terminals 101, 301 are supplied to the delay elements 102, 302. The attenuation factors of the attenuators 407, 507 in the ninth and tenth embodiments are determined based on a relationship between delay times of the delayed signals outputted from the delay elements 102, 302. That is, if the delay times of the delayed signals outputted from the delay elements 102, 302 are large, then the attenuated amounts of the delayed signals are increased, and the attenuation factors of the attenuators 407, 507 are set in such a manner that the impulse responses outputted from the FIR filters 105, 305 become close to an impulse response actually measured. Conversely, if the delay times of the delayed signals outputted from the delay elements 102, 302 are small, then the attenuated amounts of the delayed signals are decreased, and similarly as described above, the attenuation factors of the attenuators 407, 507 are set in such a manner that the impulse responses outputted from the FIR filters 105, 305 become close to the impulse response actually measured.

The delay times of the signals supplied to the attenuators 407, 507 in the ninth and tenth embodiments are set arbitrarily.

Specifically, according to the ninth and tenth embodiments, since the outputted signals of the delay elements are fed to the input terminals of the delay elements so that the delayed signals are attenuated and then inputted to the delay elements one more time, the input attenuated at a constant ratio is repetitively inputted to the FIR filter at a constant period, whereby the apparent tap length of the FIR filter can be extended more.

Therefore, according to the ninth and tenth embodiments, since the long impulse response can be reproduced even by use of the FIR filter with a short tap length, the scale of the signal processing apparatus can be reduced considerably, the number of ICs required when the signal processing apparatus is composed of digital signal processing ICs can be decreased considerably, a power consumption can be decreased, and the system can be arranged inexpensively.

The fifth to tenth embodiments can be applied to the acoustic reproducing apparatus shown in FIGS. 6 and 7 similarly to the first to fourth embodiments. The signal processing apparatus 63 of the acoustic reproducing apparatus shown in FIG. 6 comprises the filters 73, 74, 75 and 76 as shown in FIG. 7. These filters 73, 74, 75 and 76 are used to measure four kinds of impulse responses ranging from the sound generating source, such as the speaker system located at the front to listener's ears and to superimpose response characteristics upon the digital signal. These filters 73, 74, 75 and 76 are arranged by use of the signal processing apparatus shown in the fifth to tenth embodiments.

Specifically, in the apparatus shown in FIG. 7, if the filters for superimposing the impulse responses from the sound generation source to the listener's ears upon the digital signal are composed of the signal processing apparatus of the fifth to tenth embodiments, then localization of reproduced sound image and forward localization can be considerably improved as compared with the case that the above filters are composed of conventional FIR filters each with the constant sampling frequency and the taps of the same number in total.

In the acoustic reproducing apparatus shown in FIGS. 6 and 7, there is shown the system for producing localization of a reproduced image by use of the headphone. However, the signal processing apparatus can be applied to the replacement of FIR processing in the system where sounds are reproduced from the speakers and reproduced sound images are localized up to the outside of the two speakers.

Incidentally, it is needless to say that the present invention can be variously modified without greatly departing from the scope of the present invention.

We claim:

1. A signal processing apparatus in which an impulse response ranging from a previously-determined sound generation source to a measurement point is superimposed upon a digital audio signal and output as a resultant digital audio signal, said signal processing apparatus comprising:

signal processing means for delaying a digital audio signal and attenuating said delayed signal;

an FIR filter for superimposing an impulse response upon said attenuated and delayed digital audio signal output from said signal processing means, and adding means for adding an output from said signal processing means to said digital audio signal and supplying said added output from said adding means to said FIR filter.

2. A signal processing apparatus as claimed in claim 1, wherein said signal processing means includes delay means for delaying said digital audio signal and attenuating means for attenuating an output signal from said delay means.

3. A signal processing apparatus as claimed in claim 1, wherein said signal processing means includes first processing means for delaying said digital audio signal by a first time duration, attenuating said delayed signal by a first attenuation amount, and outputting a first processed signal, and second processing means for delaying said digital audio signal by a second time duration different from said first time duration and attenuating said signal delayed by said second time duration by a second attenuation amount larger than said first attenuation amount.

4. An acoustic reproducing apparatus comprising:

first converting means for converting an analog audio signal to a digital audio signal;

signal processing means for superimposing an impulse response ranging from a previously-measured sound generation source to a measurement point upon said digital audio signal supplied thereto from said first converting means, said signal processing means including:

signal delaying means for delaying and attenuating said digital audio signal supplied thereto from said first converting means, and an FIR filter supplied with an output from said signal delaying means and said digital audio signal supplied from said first converting means, wherein said FIR filter includes means for superimposing said impulse response ranging from said previously-measured sound generation source to said measurement point upon said signal supplied thereto from said signal delaying means;

second converting means for converting an output signal from said signal processing means to an analog signal; and electroacoustic transducer means for converting said analog signal from said second converting means to an audible sound.

5. An acoustic reproducing apparatus according to claim 4, further comprising adding means for adding said output from said signal delaying means and said digital audio signal supplied from said first converting means, wherein an output signal from said adding means is supplied to said FIR filter.

6. An acoustic reproducing apparatus as claimed in claimed 4, wherein said signal delaying means includes delay means for delaying said digital audio signal supplied thereto from said first converting means and attenuating means for attenuating an output signal from said delay means.

7. An acoustic reproducing apparatus as claimed in claim 4, wherein said signal delaying means includes first processing means for delaying said digital audio signal supplied thereto from said first converting means by a first time duration, attenuating said delayed signal by a first attenuation amount, and outputting a first processed signal, and second processing means for delaying said digital audio signal supplied thereto from said first converting means by a second time duration different from said first time duration and attenuating a signal delayed by said second time duration by a second attenuation amount larger than said first attenuation amount.

* * * * *